US008860205B2

(12) United States Patent
Muthukumar et al.

(10) Patent No.: US 8,860,205 B2
(45) Date of Patent: Oct. 14, 2014

(54) METHOD OF STIFFENING CORELESS PACKAGE SUBSTRATE

(75) Inventors: Sriram Muthukumar, Chandler, AZ (US); Nicholas R. Watts, Phoenix, AR (US); John S. Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/857,332

(22) Filed: Aug. 16, 2010

(65) Prior Publication Data

US 2010/0301492 A1 Dec. 2, 2010

Related U.S. Application Data

(62) Division of application No. 12/378,953, filed on Feb. 19, 2009, now Pat. No. 7,851,269.

(51) Int. Cl.
| | |
|---|---|
| *H01L 23/12* | (2006.01) |
| *H01L 23/498* | (2006.01) |
| *H05K 3/28* | (2006.01) |
| *H05K 1/02* | (2006.01) |
| *H05K 3/46* | (2006.01) |

(52) U.S. Cl.
CPC . *H01L 23/49822* (2013.01); *H01L 2224/16225* (2013.01); *H05K 1/0271* (2013.01); *H05K 2203/0582* (2013.01); *H05K 3/4682* (2013.01); *H05K 3/28* (2013.01)
USPC .......................................... 257/701; 438/125

(58) Field of Classification Search
CPC .............. H01L 2924/151; H01L 2224/33519; H01L 23/49822; H05K 2203/0582
USPC .......... 257/685, 686, 701–703, 773; 438/121, 438/122, 125
See application file for complete search history.

(56) References Cited

U.S. PATENT DOCUMENTS

| | | | |
|---|---|---|---|
| 5,736,456 A * | 4/1998 | Akram | 438/614 |
| 6,515,357 B2 * | 2/2003 | Urushima | 257/678 |
| 6,989,593 B2 | 1/2006 | Khan et al. | |
| 7,038,312 B2 | 5/2006 | Khan et al. | |
| 7,427,557 B2 * | 9/2008 | Rinne et al. | 438/612 |
| 7,517,730 B2 | 4/2009 | Cho | |
| 7,879,715 B2 * | 2/2011 | Nair et al. | 438/614 |
| 2003/0143830 A1 * | 7/2003 | Akram | 438/612 |
| 2005/0133905 A1 | 6/2005 | Zhao et al. | |
| 2005/0179143 A1 | 8/2005 | Moxham | |
| 2008/0002374 A1 * | 1/2008 | Fukuzono et al. | 361/748 |
| 2009/0052150 A1 * | 2/2009 | Kobayashi | 361/767 |
| 2009/0321949 A1 * | 12/2009 | Sim et al. | 257/777 |

\* cited by examiner

*Primary Examiner* — Shaun Campbell
(74) *Attorney, Agent, or Firm* — Blakely, Sokoloff, Taylor & Zafman LLP

(57) ABSTRACT

Embodiments of the present invention relate to a method of stiffening a semiconductor coreless package substrate to improve rigidity and resistance against warpage. An embodiment of the method comprises disposing a sacrificial mask on a plurality of contact pads on a second level interconnect (package-to-board interconnect) side of a coreless package substrate, forming a molded stiffener around the sacrificial mask without increasing the effective thickness of the substrate, and removing the sacrificial mask to form a plurality of cavities in the molded stiffener corresponding to the contact pads. Embodiments also include plating the surface of the contact pads and the sidewalls of the cavities in the molded cavities with an electrically conductive material.

20 Claims, 4 Drawing Sheets

METHOD OF STIFFENING CORELESS PACKAGE SUBSTRATE

This is a Divisional application of Ser. No. 12/378,953 filed Feb. 19, 2009 now U.S. Pat. No. 7,851,269, which is presently pending.

FIELD

Embodiments of the present invention relate to semiconductor substrate technology, and in particular, a method of stiffening a coreless package substrate.

BACKGROUND

Conventional semiconductor package substrates typically include at least one core layer impregnated in a dielectric material to provide mechanical rigidity to the substrate. Latest trends of electronic devices such as mobile phones, mobile internet devices (MIDs), multimedia devices and computer notebooks demand for slimmer and lighter designs. Coreless substrates are adopted for fabrication of components in such electronic devices to enable a thinner profile of the components. The thickness of coreless substrates can be, for example, as little as approximately 25% of the thickness of cored substrates.

However, coreless substrates are more susceptible to warpage problem during Surface Mount Technology (SMT) processes compared to conventional substrates with core layers. SMT processes typically involve subjecting package substrates to heating and cooling which in turn create expansion and contraction of the substrate. The difference in coefficient of thermal expansion (CTE) of the various materials forming the substrate results in different rates of expansion and contraction and hence stress in the substrate. The resulting stress warps the substrate and causes manufacturing problems during component package assembly as well as during surface mount process at Original Equipment Manufacturers (OEMs). Unlike conventional substrates, coreless substrates do not have a core layer to provide flexural rigidity against package warpage. It is known that materials such as glass cloth and glass fibers are impregnated in the dielectric material of coreless substrates to provide flexural rigidity.

BRIEF DESCRIPTION OF THE DRAWINGS

Embodiments of the invention are illustrated by way of example and are not limited in the figures of the accompanying drawings, in which like references indicate similar elements.

DETAILED DESCRIPTION

Embodiments of the present invention relate to a method of stiffening a semiconductor coreless package substrate to improve rigidity and resistance against warpage. An embodiment of the method comprises disposing a sacrificial mask on a plurality of contact pads on a second level interconnect (package-to-board interconnect) side of a coreless package substrate, forming a molded stiffener around the sacrificial mask without increasing the effective thickness of the substrate, and removing the sacrificial mask to form a plurality of cavities in the molded stiffener corresponding to the contact pads. Embodiments also include plating the surface of the contact pads and the sidewalls of the cavities in the molded stiffener with an electrically conductive material.

Figure 1:
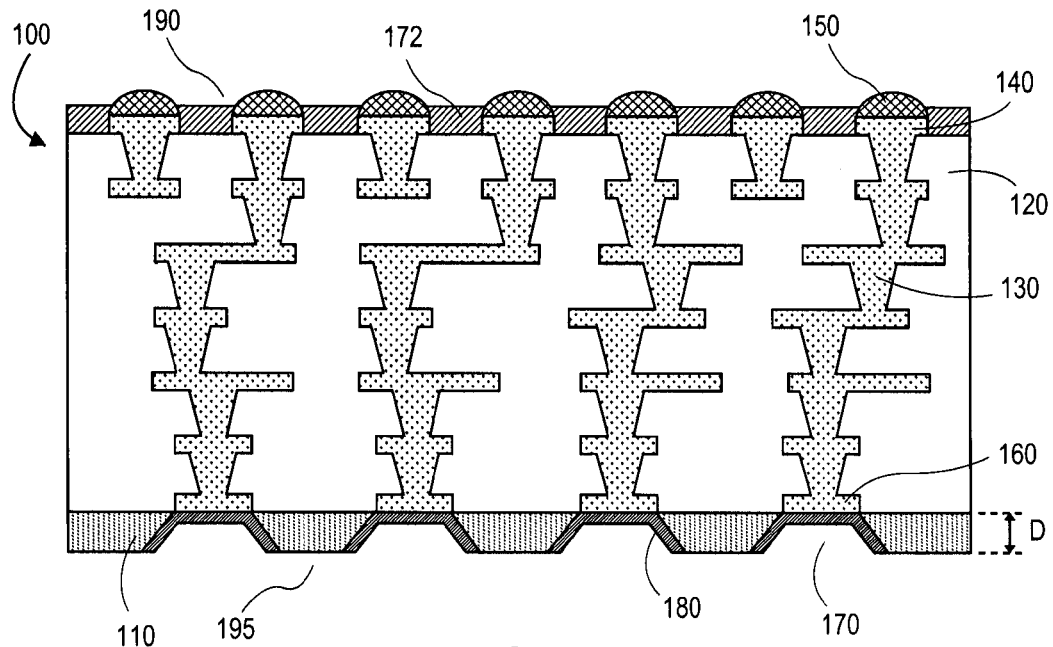
FIG. 1 is a cross-sectional view of a semiconductor substrate stiffener according to an embodiment.

FIG. 1 is a cross-sectional view of a semiconductor substrate stiffener according to an embodiment. Coreless package substrate 100 includes (i) conductive vias 130 embedded in dielectric material 120 and (ii) solder resist layer 172 formed on the top side of substrate 100 with openings corresponding to first level interconnect (FLI) contact pads 140. Top (FLI) side 190 of substrate 100 is adapted to chip-to-package interconnection. FLI contact pads 140 is connected to semiconductor die (not shown) via die bumps 150. Substrate 100 also includes a plurality of second level interconnect (SLI) contact pads 160 formed on bottom (SLI) side 195 of substrate 100. SLI side 195 of substrate 100 is adapted to package-to-board interconnection. SLI contact pads 160 are interconnected with FLI contact pads 140 via conductive vias 130. Molded stiffener 110 of thickness D is formed on SLI side 195 with cavities 170 corresponding to SLI contact pads 160 and exposing a surface of SLI contact pads 160. Other embodiments of the invention include the surface of SLI contact pads 160 and the sidewalls of cavities 170 being plated with electrically conductive surface finish 180.

Figure 2:
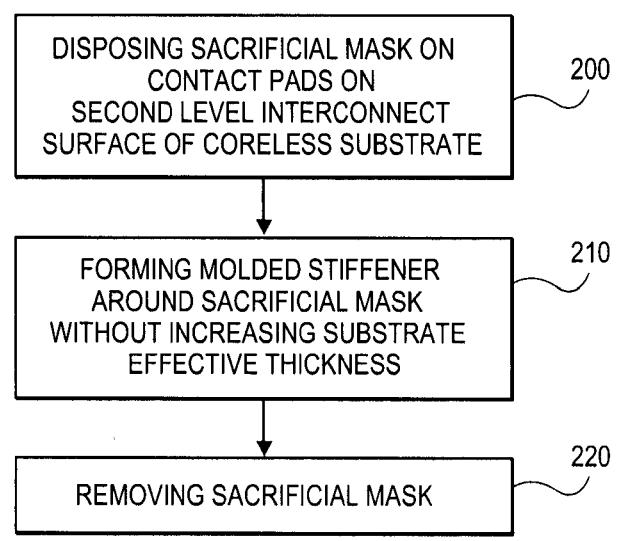
FIG. 2 is a flowchart of a method to fabricate a semiconductor substrate stiffener according to an embodiment.

FIG. 2 is a flowchart of a method to fabricate a semiconductor substrate stiffener according to an embodiment. Operation 200 includes disposing a sacrificial mask on a plurality of contact pads on the second level interconnect side of a coreless package substrate. Next, in operation 210, a layer of molded stiffener is formed around the sacrificial mask without increasing the effective thickness of the substrate. In operation 220, the sacrificial mask is then removed to form a plurality of cavities in the molded stiffener exposing the surface of the contact pads on the second level interconnect side of the substrate. For an embodiment, the surface of the contact pads and the sidewalls of the cavities are plated with an electrically conductive material. Details of the method are presented in the following paragraphs.

Figure 3:
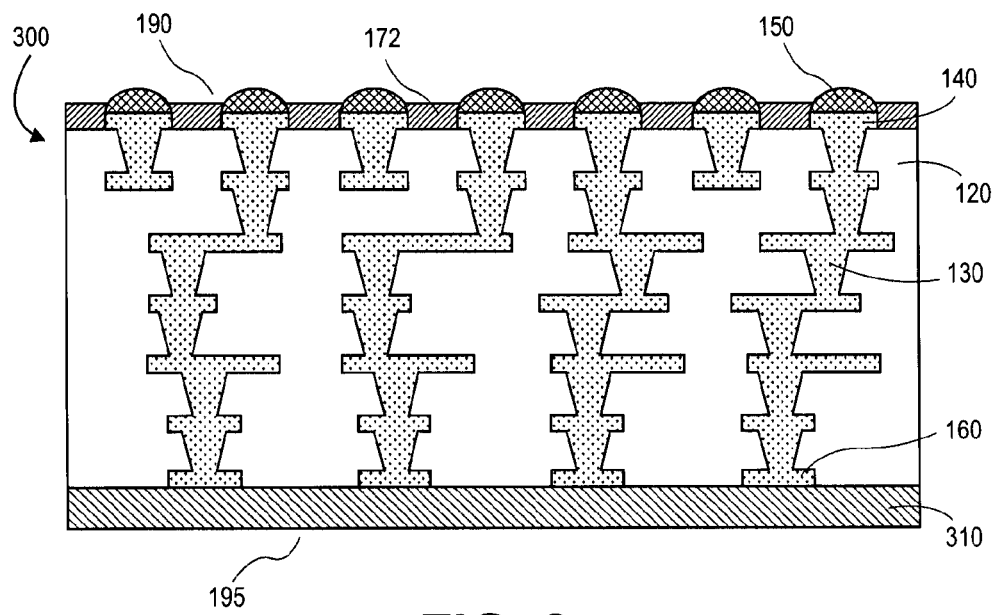
FIG. 3 is a cross-sectional view of an initial build-up of a semiconductor substrate having a sacrificial mask disposed according to an embodiment.

FIG. 3 is a cross-sectional view of an initial build-up of a semiconductor substrate having a sacrificial mask disposed according to an embodiment. Coreless package substrate 300 is fabricated using known processes through post-panel separation. FLI side 190 includes solder resist 172 formed with openings exposing FLI contact pads 140. SLI side 195 is not covered by solder resist. The surface of SLI contact pads 160 may be planar with or extending above the surface of SLI side 195 of substrate 300.

First, a layer of sacrificial mask 310 is disposed on SLI side 195 to mask the surface of SLI contact pads 160. Sacrificial mask 310 includes any chemical that is photoimagable and thermally decomposable. A variety of sacrificial mask 310 is available from the market traded under brand names such as Unity series (from Hitachi). For an embodiment, sacrificial mask 310 is a polycarbonate-based polymer thermally decomposable at temperature higher than the mold cure temperature of molded stiffener 110. For an embodiment, sacrificial mask 310 is thermally decomposable at around 180° C. and higher. Sacrificial mask 310 may include chemicals such as polynorbornene or poly (alkyl carbonates), which upon thermal decomposition, are broken down as volatile organic compounds or gases, and leave behind minimal residues to be removed.

Sacrificial mask 310 can be applied to SLI side 195 in various known methods such as lamination, spraying, needle or jet dispensation. The thickness of sacrificial mask 310 disposed on SLI side 195 depends on, among others, the design rules and considerations for substrate 300 and the type of SLI interconnect substrate 300 is adapted for. For example, where substrate 300 is designed to have solder spheres (not shown) as the type of interconnect between substrate 300 and board, the thickness of sacrificial mask 310 may be about half the height of the solder spheres.

Figure 4:
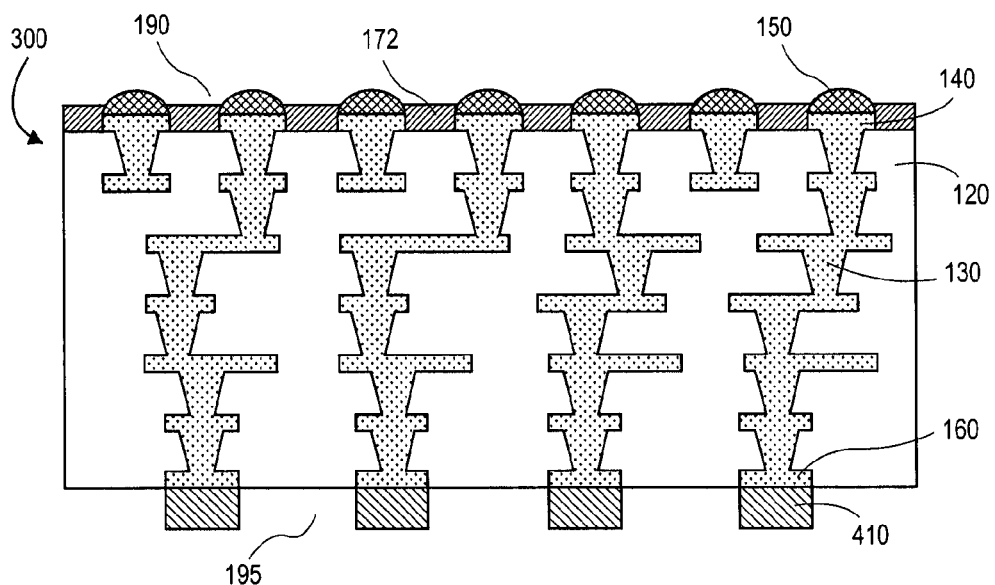
FIG. 4 is a cross-sectional view of a semiconductor substrate after a sacrificial mask being exposed and developed according to an embodiment.

After disposing sacrificial mask 310 on SLI side 195, sacrificial mask 310 is patterned to define portions 410 sacrificial mask 310 remaining only on SLI contact pads 160. FIG. 4 is a cross-sectional view of a semiconductor substrate after a sacrificial mask being exposed and developed according to an embodiment. Portions 410 of sacrificial mask 310 corresponding to SLI contact pads 160 are retained while portions of sacrificial mask 310 around SLI contact pads 160 are removed. Where sacrificial mask 310 is a polymer, patterning of sacrificial mask 310 yields a plurality of polymer islands remaining on the SLI contact pads 160. Known photolithography methods such as exposure to ultra-violet (UV), I-line, G-line and etching may be employed to define and pattern portions 410 of sacrificial mask 310 remaining on SLI contact pads 160. The type and steps of patterning and developing sacrificial mask 310 may be influenced by the type and chemical composition of sacrificial mask 310 used in the process as determined by a person of ordinary skill in the art. Cleaning is performed to remove any residue left behind by sacrificial mask 310.

Figure 5:
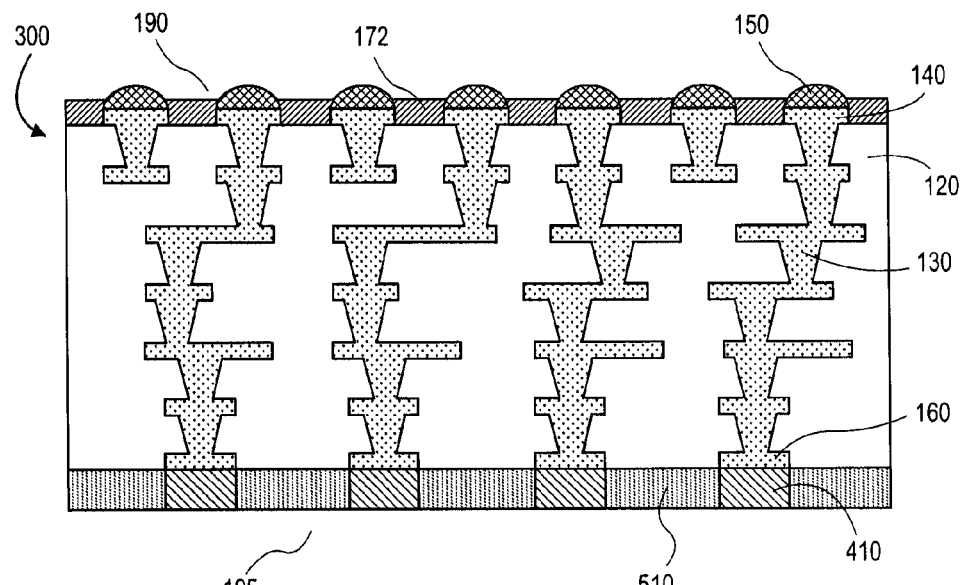
FIG. 5 is a cross-sectional view of a semiconductor substrate having a stiffening layer formed around the remaining sacrificial mask according to an embodiment.

Next, a stiffening layer is formed on SLI side 195. Embodiments of the invention include forming a stiffening layer by way of molding. FIG. 5 is a cross-sectional view of a semiconductor substrate having a molded stiffener formed around remaining portions 410 of sacrificial mask 310 according to an embodiment. Molding of stiffening layer 510 can be achieved using known molding techniques. Substrate 300 is loaded in a molding chassis. Molding compound is introduced in the molding chassis and flows into regions of SLI side 195 not masked with portions 410 sacrificial mask 310. Substrate 300 is clamped under pressure to allow the molding compound to stabilize and partially cure to form stiffening layer 510.

The height of stiffening layer 510 is planar with remaining portions 410 of sacrificial mask 310 masking SLI contact pads 160. Height D of stiffening layer 510 (as shown in FIG. 1) is also such that stiffening layer 510 insignificantly increase or does not increase the effective thickness of substrate 300. For example, by forming stiffening layer 510 of height D on SLI side 195 of substrate 300, the standoff or clearance between SLI side 195 and an adjacent surface of a circuit board (not shown) to which substrate 300 is connected via an interconnect (not shown) would not be increased. For an embodiment, height D of stiffening layer 510 is about half the height of solder spheres connecting substrate 300 to a circuit board. For another embodiment, height D of stiffening layer 510 is at least approximately 50 μm. Stiffening layer 510 has a lower coefficient of thermal expansion (CTE) and a higher flexural modulus relative to substrate 300. For an embodiment, stiffening layer 510 has coefficient of thermal expansion at room temperature between 3 ppm/° C. and 15 ppm/° C. For an embodiment, stiffening layer 510 has flexural modules between 10 kN/mm$^2$ and 50 kN/mm$^2$.

Figure 6:
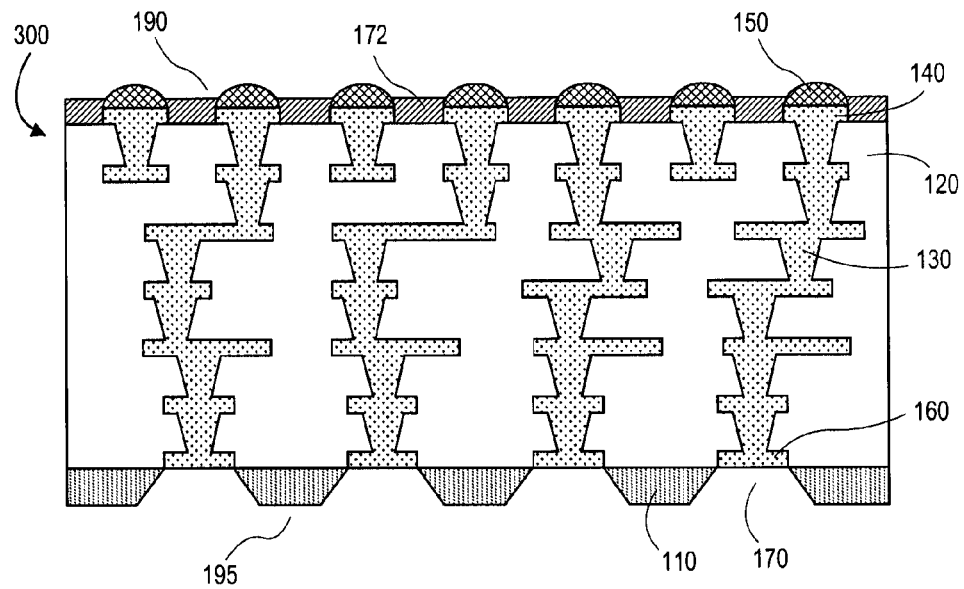
FIG. 6 is a cross-sectional view of a semiconductor substrate having the remaining sacrificial mask removed and cavities in molded stiffener formed according to an embodiment.

After forming stiffening layer 510, cavities 170 in stiffening layer 510 are formed to house interconnects adapted for interconnection between substrate 300 and circuit board. Remaining portions 410 of sacrificial mask 310 are removed by thermally decomposing the same. FIG. 6 is a cross-sectional view of a semiconductor substrate having the remaining sacrificial mask removed and cavities in a molded stiffener formed according to an embodiment. For an embodiment, substrate 300 is baked to thermally decompose portions 410 of sacrificial mask 310 remaining SLI contact pads 160, followed by post-mold cure to completely cure stiffening layer 510. Substrate 300 is baked at around 180° C. and higher. Post-mold cure is carried out at around 125° C. and higher. For another embodiment, substrate 300 is simultaneously having stiffening layer 510 cured and portions 410 of sacrificial mask 310 thermally decomposed at around 180° C. and higher to form molded stiffener 110 and cavities 170 in molded stiffener 110. Substrate 300 is subsequently cleaned to remove any chemicals or residue left behind by thermal decomposition of portions 410 of sacrificial mask 310. Various known methods of cleaning such as plasma etching may be employed. Removal of residues left in cavities 170 ensures that the surface of SLI contact pads 160 is free from any foreign material prior to subsequent surface treatment process.

For an embodiment, cavities 170 defined by molded stiffener 110 have a tapering profile. The tapering profile is a result of interactive effects between portions 410 of sacrificial mask 310 and curing mechanism of molding compound forming stiffening layer 510. The tapering profile is also affected by the process parameters during the thermal decomposition of sacrificial mask 310 and molding of stiffening layer 510. The tapering profile of cavities 170 in molded stiffener 110 may be positive or negative as a result of the aforementioned interactive effects and process parameters. However, embodiments of the invention do not preclude cavities 170 from having a non-tapering profile. Interconnects, such as solder spheres and contact pins, when disposed in cavities 170, contact with the surface of SLI contact pads 160.

Figure 7:
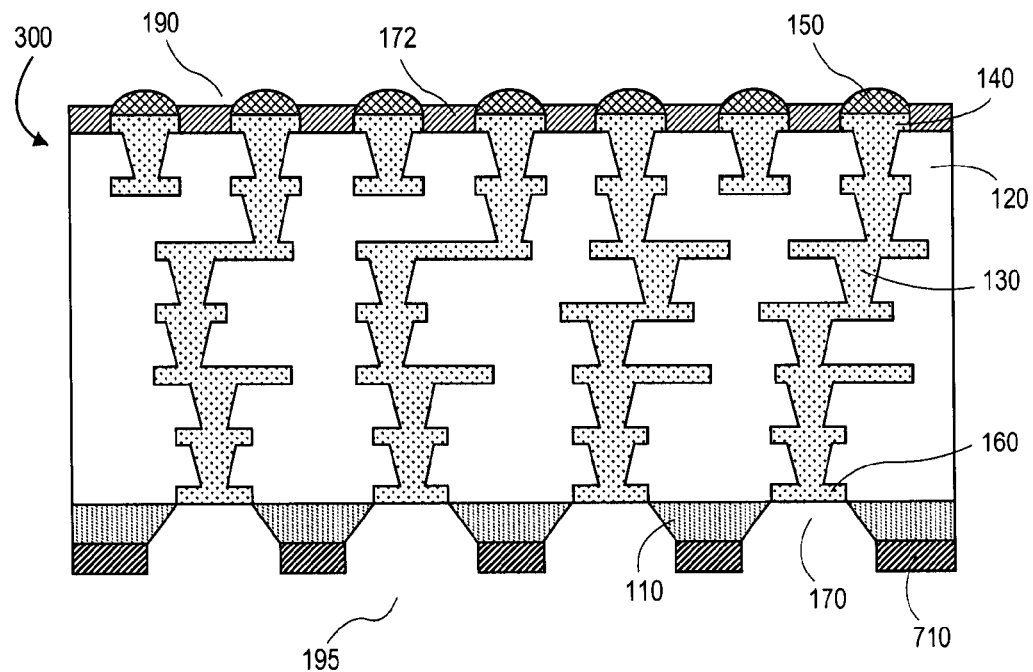
FIG. 7 is a cross-sectional view of a semiconductor substrate having a photoimagable material formed on molded stiffener and on regions around cavities in a molded stiffener according to an embodiment.

An embodiment of the method to stiffen substrate 300 further comprises plating the surface of SLI contact pads 160 and the sidewalls of cavities 170 with an electrically conductive material. For an embodiment, plating comprises first depositing and patterning a photoimagable material on molded stiffener 110 followed by depositing surface finish 180 on cavities 170 and SLI contact pads 160. FIG. 7 is a cross-sectional view of a semiconductor substrate having a photoimagable material formed on molded stiffener and on regions around cavities in a molded stiffener according to an embodiment. Photoimagable material 710 may include a composition of reactive monomeric and/or polymeric substances along with photoactivated initiators. Photoimagable material 710, when exposed to light of proper wavelength, will activate cross-linking of catalysts, initiators or activate free radical polymerization of monomers (or polymers) in the composition. Photoactivation will transform a positive-acting composition from an insoluble state to a soluble state while a negative-acting composition will be transformed from a soluble state to an insoluble state. Readily-available photoimagable material 710 products are available in the market under various brand names suited for specific application and process needs. Photoimagable material 710 is patterned on the surface of molded stiffener 110 to mask regions where plating is not intended. A mask is employed to mask the openings of cavities 170 during the patterning of photoimagable material on molded stiffener 110. Known methods of lithography may be used for patterning of photoimagable material 710.

Figure 8:
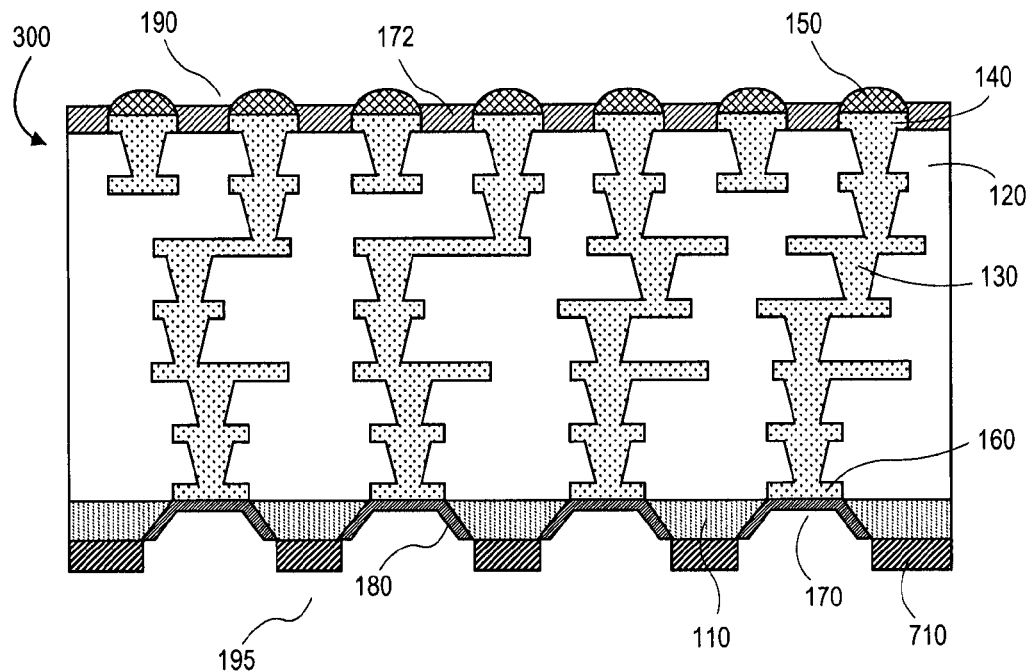
FIG. 8 is a cross-sectional view of a semiconductor substrate having the surface of contact pads and the sidewalls of cavities in molded stiffener being plated according to an embodiment.

Next, electrically conductive surface finish 180 is deposited on the surface of SLI contact pads 160 and the sidewalls of cavities 170. FIG. 8 is a cross-sectional view of a semiconductor substrate having the surface of contact pads and the sidewalls of cavities in molded stiffener being plated according to an embodiment. For an embodiment, the plating process is electroless plating. Electroless plating of surface finish 180 on the surface of SLI contact pads 160 and the sidewalls of cavities 170 may include electroless copper, electroless Nickel/Immersion Gold (ENIG) plating and electroless gold plating. For another embodiment, the plating process is an electrolytic plating process. After plating surface finish 180 on the surface of SLI contact pads 160 and the sidewalls of cavities 170, photoimagable material 710 is removed. Photoimagable material 710 is removed by develop methods known in the art. Substrate 300 may then be subjected to known substrate fabrication steps.

Embodiments of the invention provide a method to stiffen coreless package substrates without increasing the effective thickness of the substrates. The stiffening provides coreless package substrates with improved rigidity and resistance against package warpage.

In the foregoing specification, reference has been made to specific embodiments of the invention. It will, however be evident that various modifications and changes may be made thereto without departing from the broader spirit and scope of the invention. The specification and drawings are, accordingly, to be regarded in an illustrative rather than restrictive sense.

What is claimed is:

1. A coreless package substrate, comprising:
   a coreless substrate having a first level interconnect side comprising a plurality of first level interconnect contact pads and a second level interconnect side comprising a plurality of second level interconnect contact pads wherein said coreless substrate comprises a plurality of dielectric layers separating said first level interconnect side from said second level interconnect side and wherein a plurality of levels of conductive vias are utilized to interconnect said first level interconnect contact pads to said second level interconnect contact pads;
   a stiffener formed from a molding compound on the second level interconnect side, the molded stiffener having a plurality of cavities corresponding to said plurality of second level interconnect contact pads; and
   wherein said stiffener has a lower coefficient of thermal expansion (CTE) than said coreless substrate, said stiffener is not on any portion of said plurality of second level interconnect pads, said stiffener is not directly laterally adjacent to any portion of said plurality of second level interconnect pads.

2. The coreless package substrate of claim 1, further comprising an electrically conductive surface finish on the surface of the plurality of second level interconnect contact pads and the sidewalls of the cavities.

3. The coreless package substrate of claim 2, wherein the cavities have a tapering profile.

4. The coreless package substrate of claim 1 wherein said stiffener does not increase the effective thickness of said coreless substrate.

5. The coreless package substrate of claim 1 wherein said stiffener has a thickness of at least approximately 50 μm.

6. The coreless package substrate of claim 1 wherein said stiffener has a coefficient of thermal expansion at room temperature between 3 ppm/° C. and 15 ppm/° C.

7. The coreless package substrate of claim 1 wherein said stiffener has a higher flexural modules than said coreless substrate.

8. The coreless package substrate of claim 1 wherein said stiffener has a flexural modules between 10 kN/mm$^2$ and 50 kN/mm$^2$.

9. A coreless package substrate comprising:
   a coreless substrate having a first level interconnect side comprising a plurality of first level interconnect contact pads and a second level interconnect side comprising a plurality of second level interconnect contact pads wherein said coreless substrate comprises a plurality of dielectric layers separating said first level interconnect side from said second level interconnect side and wherein a plurality of levels of conductive vias are utilized to interconnect said first level interconnect contact pads to said second level interconnect contact pads;
   a stiffener comprising a molding compound disposed on the second level interconnect side, the stiffener having a plurality of cavities corresponding to said plurality of second level interconnect contact pads; and
   wherein said stiffener has a higher flexural modules than said coreless substrate, said stiffener is not on any portion of said plurality of second level interconnect pads, said stiffener is not directly laterally adjacent to any portion of said plurality of second level interconnect pads.

10. The coreless package substrate of claim 9 wherein said stiffener does not increase the effective thickness of said coreless substrate.

11. The coreless package substrate of claim 9 wherein said stiffener has a thickness of at least approximately 50 μm.

12. The coreless package substrate of claim 9 wherein said stiffener has a lower coefficient of thermal expansion (CTE) than said coreless substrate.

13. The coreless package substrate of claim 9 wherein said stiffener has a coefficient of thermal expansion at room temperature between 3 ppm/° C. and 15 ppm/° C.

14. The coreless package substrate of claim 9 wherein said stiffener has a flexural modules between 10 kN/mm$^2$ and 50 kN/mm$^2$.

15. The coreless package substrate of claim 9 further comprising an electrically conductive surface finish on the surface of the second level interconnect contact pads and the sidewalls of the cavities.

16. The coreless package substrate of claim 9 wherein the cavities have a tapering profile.

17. The coreless package substrate of claim 9 wherein said stiffener is a molded stiffener.

18. A coreless package substrate comprising:
   a coreless substrate having a first level interconnect side comprising a plurality of first level interconnect contact pads and a second level interconnect side comprising a plurality of second level interconnect contact pads wherein said coreless substrate comprises a plurality of dielectric layers separating said first level interconnect side from said second level interconnect side and wherein a plurality of levels of conductive vias are utilized to interconnect said first level interconnect contact pads to said second level interconnect contact pads; and a stiffener comprising a molding compound disposed on the second level interconnect side, the stiffener having a plurality of cavities surrounded by a planar surface, said plurality of cavities corresponding to said plurality of second level interconnect contact pads and an electrically conductive surface finish on the surface of the second level interconnect contact pads and on the sidewalls of the cavities wherein the electrically conductive surface finish on the sidewalls of the cavity extends from said planar surface to said second level contact pads and not on said planar surface and not above said planar surface.

19. The coreless package substrate of claim 18 wherein the cavities have a tapering profile.

20. The coreless package substrate of claim 18 wherein said stiffener has a lower coefficient of thermal expansion (CTE) than said coreless substrate.

* * * * *